United States Patent
Chen et al.

(10) Patent No.: US 8,476,694 B2
(45) Date of Patent: Jul. 2, 2013

(54) MEMORY CELL, MEMORY DEVICE AND METHOD FOR MANUFACTURING MEMORY CELL

(75) Inventors: Po-Chou Chen, Hsinchu (TW); Yao-Wen Chang, Hsinchu (TW); I-Chen Yang, Hsinchu (TW)

(73) Assignee: MACRONIX International Co., Ltd, Hsinchu (TW)

( * ) Notice: Subject to any disclaimer, the term of this patent is extended or adjusted under 35 U.S.C. 154(b) by 309 days.

(21) Appl. No.: 12/877,284

(22) Filed: Sep. 8, 2010

(65) Prior Publication Data

US 2012/0056259 A1   Mar. 8, 2012

(51) Int. Cl.
*H01L 29/788*   (2006.01)

(52) U.S. Cl.
USPC .... 257/321; 257/324; 257/390; 257/E29.304; 257/E29.309

(58) Field of Classification Search
USPC ........... 257/321, 324, 390, E29.304, E29.309
See application file for complete search history.

(56) References Cited

U.S. PATENT DOCUMENTS

| | | | | |
|---|---|---|---|---|
| 7,838,920 B2 * | 11/2010 | Ghodsi | ........................ | 257/314 |
| 7,838,923 B2 * | 11/2010 | Lue | ............................... | 257/324 |
| 2006/0221692 A1 * | 10/2006 | Chen | ........................ | 365/185.11 |
| 2008/0157263 A1 * | 7/2008 | Melik-Martirosian | ....... | 257/510 |

\* cited by examiner

*Primary Examiner* — Minh-Loan T Tran
(74) *Attorney, Agent, or Firm* — J.C. Patents

(57) ABSTRACT

A memory cell including a substrate, a stacked gate structure and a first isolation structure is provided. The substrate has a first doped region, a second doped and a channel region located between the first doped region and the second doped region. The stacked gate structure is disposed on the channel and at least includes a charge trapping layer and a gate from bottom to top. The first isolation structure is disposed in the substrate and is connected to the first doped region and extends downwards from the first doped region for a predetermined length, and a bottom of the first isolation structure is lower than a bottom of the first doped region.

14 Claims, 6 Drawing Sheets

MEMORY CELL, MEMORY DEVICE AND METHOD FOR MANUFACTURING MEMORY CELL

BACKGROUND

1. Field of the Invention

The invention relates to a memory device. More particularly, the invention relates to a memory cell, a memory device and a method for manufacturing a memory cell.

2. Description of Related Art

An electrically erasable programmable read only memory (EEPROM) of a non-volatile memory has advantages of performing multiple data program, read and erase operations and maintaining stored data during power-off, it becomes a memory device widely used by personal computers and electronic equipments.

During a program process of a memory cell of the EEPROM that is performed through channel hot electrons, holes generated on a surface of a substrate due to an impact ionization can probably cause a secondary impact ionization in a direction of the substrate to generate more pairs of electrons and holes. Since sizes of the memory cells become smaller, and a source/drain doped region is shared, the generated secondary hot electrons can probably cross over the doped region and lead to a program operation to an adjacent memory cell, so that data in the adjacent memory cell is influenced, and such phenomenon is referred to as program disturbance.

SUMMARY OF THE INVENTION

An embodiment of the present invention is directed to a memory cell and a memory device thereof, in which an isolation structure capable of isolating electrons is disposed beneath a source/drain doped region, so as to prevent electrons generated by impact ionization from moving to an adjacent memory cell through the underneath of the doped region to cause a program disturbance.

An embodiment of the present invention is directed to a method for manufacturing a memory cell, by which an isolation structure is formed beneath a source/drain doped region, so as to prevent electron from moving to an adjacent memory cell to cause a program disturbance.

Accordingly, an embodiment of the invention provides a memory cell including a substrate, a stacked gate structure and a first isolation structure. The substrate has a first doped region, a second doped region and a channel region located between the first doped region and the second doped region. The stacked gate structure is disposed on the channel region and at least includes a charge trapping layer and a gate from bottom to top. The first isolation structure is disposed in the substrate, is connected to the first doped region and extends downwards from the first doped region for a predetermined length, and a bottom of the first isolation structure is lower than a bottom of the first doped region.

In an embodiment of the invention, the memory cell further includes a second isolation structure disposed in the substrate. The second isolation structure is connected to the second doped region and extends downwards from the second doped region for the predetermined length, and a bottom of the second isolation structure is lower than a bottom of the second doped region.

In an embodiment of the invention, materials of the second isolation structure and the first isolation structure are the same.

In an embodiment of the invention, a dielectric constant of the first isolation structure is higher than a dielectric constant of the substrate.

In an embodiment of the invention, a material of the first isolation structure is, for example, $SiO_2$, $SiN_x$ or gas.

In an embodiment of the invention, a width of the first isolation structure is less than a width of the first doped region.

In an embodiment of the invention, the predetermined length is between 300 Å and 1500 Å.

An embodiment of the invention provides a memory device including a driving circuit and a memory cell array. The memory cell array is coupled to the driving circuit, wherein the memory cell array has a plurality of memory cells connected with each other, and each of the memory cells includes a substrate, a stacked gate structure and a first isolation structure. The substrate has a first doped region, a second doped region and a channel region located between the first doped region and the second doped region. The stacked gate structure is disposed on the channel region and at least includes a charge trapping layer and a gate from bottom to top. The first isolation structure is disposed in the substrate, is connected to the first doped region and extends downwards from the first doped region for a predetermined length, and a bottom of the first isolation structure is lower than a bottom of the first doped region.

In an embodiment of the invention, the memory device further includes a second isolation structure disposed in the substrate. The second isolation structure is connected to the second doped region and extends downwards from the second doped region for a predetermined length, and a bottom of the second isolation structure is lower than a bottom of the second doped region.

An embodiment of the present invention further provides a method for manufacturing a memory cell. The method includes following steps. A substrate is provided, wherein a first doped region, a second doped region and a channel region are already formed in the substrate, and a stacked gate structure is already formed on the channel region. The channel region is located between the first doped region and the second doped region, and the staked gate structure at least includes a charge trapping layer and a gate from bottom to top. A first isolation structure is formed in the substrate. The first isolation structure is connected to the first doped region and extends downwards from the first doped region for a predetermined length, and a bottom of the first isolation structure is lower than a bottom of the first doped region.

In an embodiment of the invention, the step of forming the first isolation structure in the substrate includes following steps. A trench is formed in the first doped region, wherein a depth of the trench is greater than a depth of the first doped region. The first isolation structure is formed in the trench within the predetermined length. A semiconductor layer is formed to fill the trench outside the predetermined length. The first doped region is reformed in the semiconductor layer.

In an embodiment of the invention, the method for manufacturing the memory cell further includes forming a second isolation structure in the substrate, wherein the second isolation structure is connected to the second doped region and extends downwards from the second doped region for the predetermined length, and a bottom of the second isolation structure is lower than a bottom of the second doped region.

According to the above descriptions, in the present invention, the isolation structure is disposed beneath the source/drain doped region of the memory cell, so as to prevent ionized electrons from moving to an adjacent memory cell to cause a program disturbance.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the embodiments the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

First Embodiment

Figure 1:
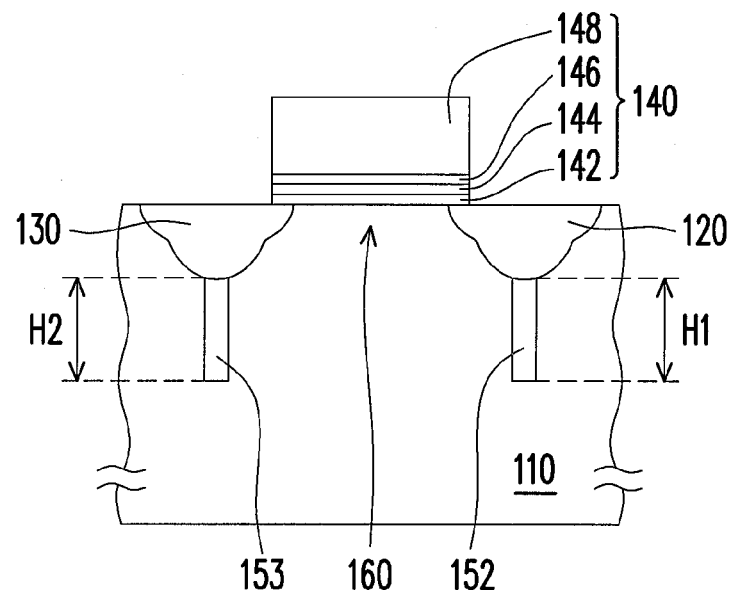
FIG. 1 is a cross-sectional view of a memory cell according to a first embodiment of the present invention.

FIG. 1 is a cross-sectional view of a memory cell according to a first embodiment of the present invention.

Referring to FIG. 1, the memory cell includes a substrate 110, a stacked gate structure 140 and an isolation structure 152.

The substrate 110 has doped regions 120 and 130 and a channel region 160 located between the doped regions 120 and 130, wherein the doped regions 120 and 130 respectively serve as a drain or a source.

The stacked gate structure 140 is disposed on the channel region 160. The stacked gate structure 140 at least includes a charge trapping layer 144 and a gate 148 from bottom to top. A material of the charge trapping layer 144 is, for example, silicon nitride. A material of the gate 148 is, for example, doped polysilicon. Moreover, the stacked gate structure 140 may selectively include a bottom dielectric layer 142 and a top dielectric layer 146, wherein the bottom dielectric layer 142 is disposed between the substrate 110 and the charge trapping layer 144, and the top dielectric layer 146 is disposed between the charge trapping layer 144 and the gate 148. Materials of the bottom dielectric layer 142 and the top dielectric layer 146 are, for example, respectively silicon oxide. The bottom dielectric layer 142, the charge trapping layer 144 and the top dielectric layer 146, for example, form an oxide-nitride-oxide (ONO) charge storage structure.

Besides the isolation structure 152, the memory cell may further include an isolation structure 153. The isolation structures 152 and 153 are respectively disposed in the substrate 110. The isolation structures 152 and 153 are respectively connected to the doped regions 120 and 130, and respectively extend downwards (i.e. a direction of the substrate 110) from the doped regions 120 and 130 for predetermined lengths H1 and H2. The predetermined lengths H1 and H2 can be determined according to an actual design requirement, which are, for example, between 300 Å and 1500 Å. Bottoms of the isolation structures 152 and 153 are respectively lower than the bottoms of the doped regions 120 and 130. Dielectric constants of the isolation structures 152 and 153 are, for example, greater than a dielectric constant of the substrate 110. The dielectric constants of the isolation structures 152 and 153 are, for example, between 1 and 12. Materials of the isolation structures 152 and 153 can be the same, which is, for example, a high dielectric material such as $SiO_2$, $SiN_x$ or gas (which represents that the isolation structures 152 and 153 are respectively a hollow structure). Moreover, shapes of the isolation structures 152 and 153 are not limited, though widths thereof are respectively less than widths of the doped regions 120 and 130.

When a high voltage is applied to the gate 148 and a drain (for example, the doped region 120), the channel region 160 is opened, so that electrons can flow to the drain (for example, the doped region 120) from a source (for example, the doped region 130), which is similar to a performance of a transistor. When the current flowing from the drain to the source is great enough, some high-energy electrons can cross over the bottom dielectric layer 142 and enter the charge trapping layer 144, and such process is referred to as hot electron injection. The electrons entering the charge trapping layer 144 can influence a threshold voltage of the memory cell, so as to complete a program operation. However, during the program process, holes generated on a surface of the substrate 110 due to an impact ionization can probably cause a secondary impact ionization in a direction of the substrate 110 to generate more pairs of electrons and holes. The isolation structures 152 and 153 can block the pairs of electrons and holes from moving to the adjacent memory cells through the underneath of the doped regions 120 and 130, so as to avoid a program disturbance.

Figure 2:
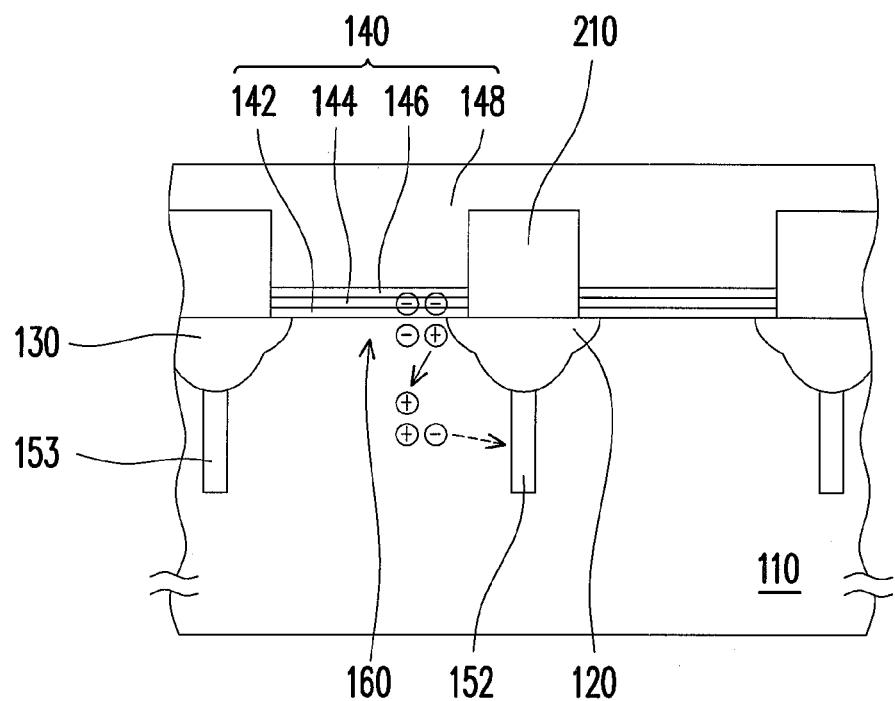
FIG. 2 is a schematic diagram illustrating a moving direction of electrons according to the first embodiment of the present invention.

FIG. 2 is a schematic diagram illustrating a moving direction of the electrons according to the first embodiment of the present invention.

Referring to FIG. 2, the electrons can be blocked by the isolation structure 152 with a higher dielectric constant, and cannot reach a charge storage structure of the adjacent memory cell, so that the program disturbance is avoided. Similarly, when the program operation is performed to the adjacent memory cells, the isolation structures 152 and 153 can also prevent the pairs of electrons and holes generated by the secondary impact ionization from influencing the stacked gate structure 140. Moreover, an insulating layer 210 is formed on the doped region 120, and a material of the insulating layer 210 is, for example, silicon oxide.

Second Embodiment

Figure 3:
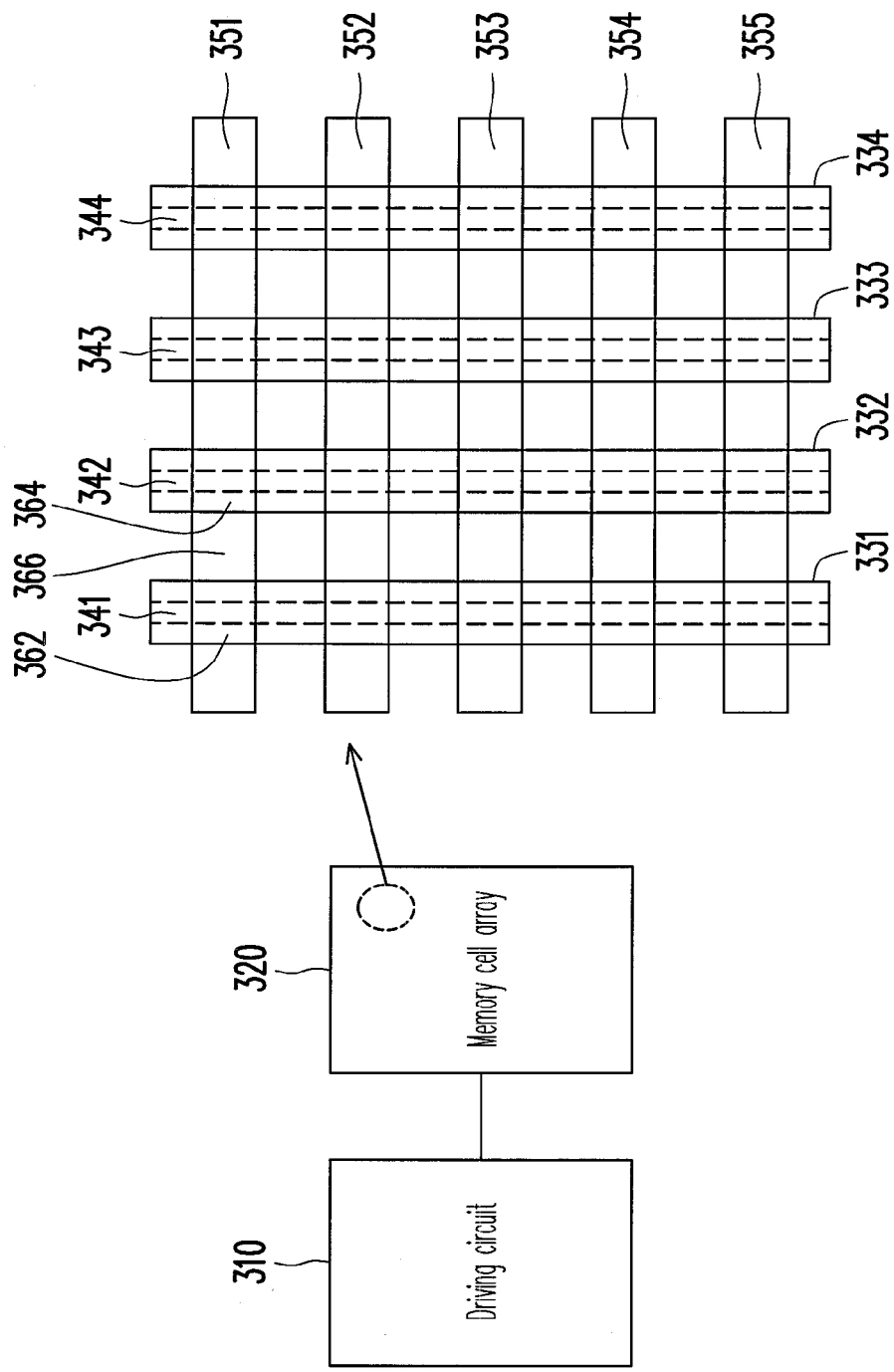
FIG. 3 is a schematic diagram illustrating a memory device according to a second embodiment of the present invention.

FIG. 3 is a schematic diagram illustrating a memory device according to a second embodiment of the present invention.

Referring to FIG. 3, the memory device includes a driving circuit 310 and a memory cell array 320. The driving circuit 310 is coupled to the memory cell array 320 for performing read or program operations to the memory cell array 320. The memory cells in FIG. 1 can be connected with each other to form the memory cell array 320. The structure of the memory cell has been described in detail in the first embodiment, so that detailed description thereof is not repeated.

As shown in FIG. 3, the memory cell array 320 has a plurality of memory cells connected with each other. Doped regions 331-334 and gates 351-355 are mutually intersected. Along an extending direction of the gates 351-355, the adjacent memory cells share a same doped region to serve as a source or a drain, and the adjacent memory cells share same gates 351-355. Taking the gate 351 as an example, regions 362 and 364 formed by parts of the doped regions 331 and 332 serve as a source and a drain of a memory cell, and a region 366 formed by a part of the gate 351 is connected to the stacked gate structure of the memory cell. Structures of the other memory cells are deduced by analogy, and detailed descriptions thereof are not repeated.

Isolation structures 341-344 are respectively disposed beneath each of the doped regions 331-334. Taking the isolation structure 341 as an example, the isolation structure 341 is connected to the doped region 331, and extends downwards from the doped region 331 for the predetermined length to avoid the program disturbance, wherein the bottom of the isolation structure 341 is lower than that of the doped region 331. Moreover, since the memory cells along an extending direction of the doped region 331 share the doped region 331, the isolation structure 341 can also be shared, and the isolation structure 341 is directly formed beneath the whole doped region 331 to serve as an isolation wall to prevent the electrons from passing through. Structures of the other isolation structures 342-344 and the doped regions 332-334 are similar as the structure of FIG. 1 and the above description, and therefore detailed descriptions thereof are not repeated.

Third Embodiment

FIGS. 4A-4G are cross-sectional views illustrating a manufacturing process of a memory cell according to a third embodiment of the present invention.

Figure 4A:
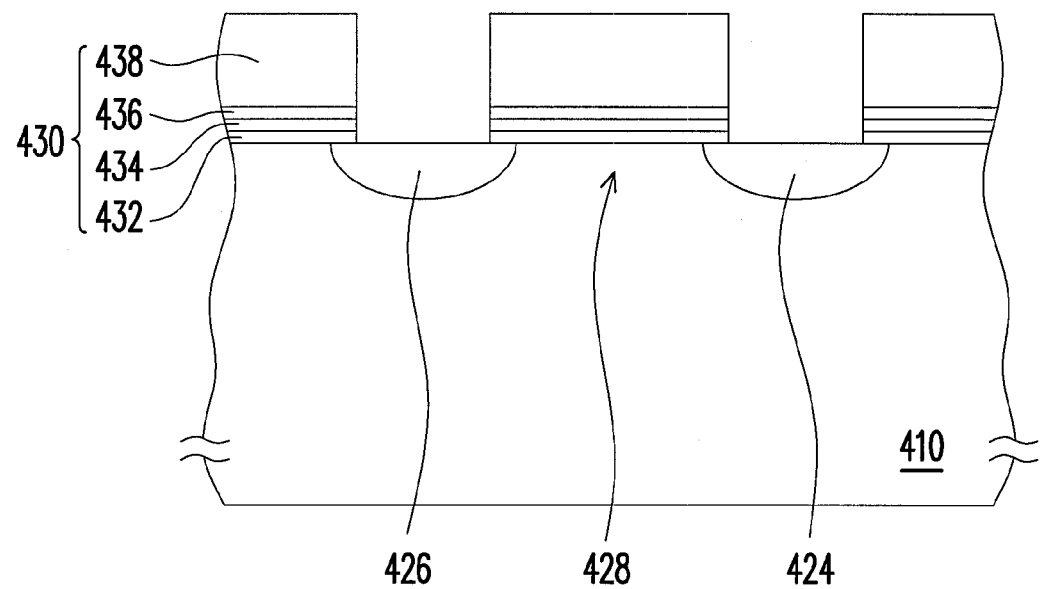
FIGS. 4A-4G are cross-sectional views illustrating a manufacturing process of a memory cell according to a third embodiment of the present invention.

First, referring to FIG. 4A, a substrate 410 is provided, wherein doped regions 424 and 426 and a channel region 428 are already formed in the substrate 410, and a stacked gate structure 430 is already formed on the channel region 428. The doped regions 424 and 426 respectively serve as a drain or a source. The staked gate structure 430 at least includes a charge trapping layer 434 and a gate 438 from bottom to top. A material of the charge trapping layer 434 is, for example, silicon nitride. A material of the gate 438 is, for example, doped polysilicon. Moreover, the stacked gate structure 430 may selectively include a bottom dielectric layer 432 and a top dielectric layer 436, wherein the bottom dielectric layer 432 is disposed between the substrate 410 and the charge trapping layer 434, and the top dielectric layer 436 is disposed between the charge trapping layer 434 and the gate 438. Materials of the bottom dielectric layer 432 and the top dielectric layer 436 are, for example, respectively silicon oxide. The bottom dielectric layer 432, the charge trapping layer 434 and the top dielectric layer 436, for example, form an oxide-nitride-oxide (ONO) charge storage structure.

Figure 4B:
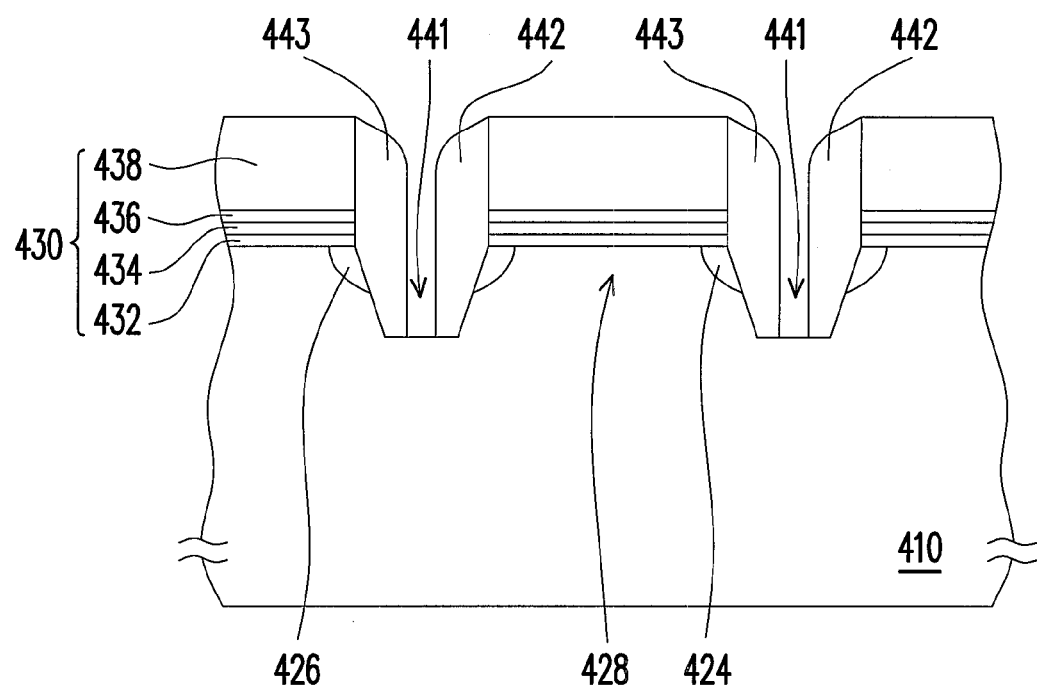

Then, referring to FIG. 4B, trenches 441 are respectively formed in the doped regions 424 and 426. A method of forming the trenches 441 is, for example, dry etching. Although a shape of the trench 441 is a trapezoid in the present embodiment, it is not used to limit the invention, and in other embodiments, the shape of the trench 441 can also be a rectangle.

Then, spacers 442 and 443 are respectively formed on sidewalls of the trenches 441 and the stacked gate structure 430. A method of forming the spacers 442 and 443 is to first form a spacer material layer of silicon oxide on the substrate 410, and then an etching back process is performed to the spacer material layer to form the spacers 442 and 443.

Figure 4C:
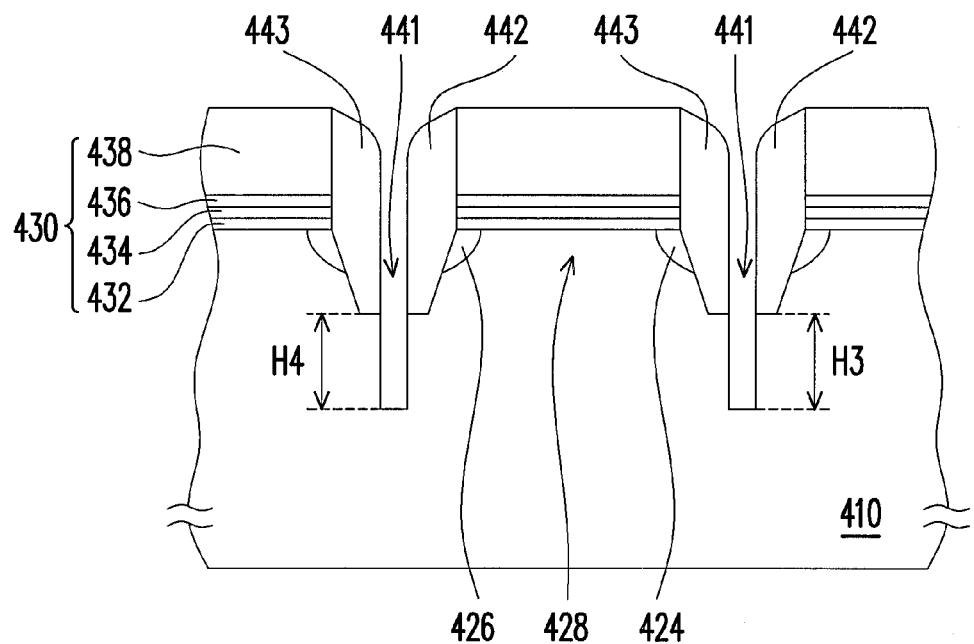

Then, referring to FIG. 4C, the spacers 442 and 443 are taken as a mask to remove a part of the substrate 410 so as to deepen the trenches 441, so that the trenches 441 extend downwards from the doped regions 424 and 426 for predetermined lengths H3 and H4, wherein the predetermined lengths H3 and H4 are determined according to an actual design requirement, which are, for example, between 300 Å and 1500 Å. Now, depths of the trenches 441 are greater than depths of the doped regions 424 and 426.

Figure 4D:
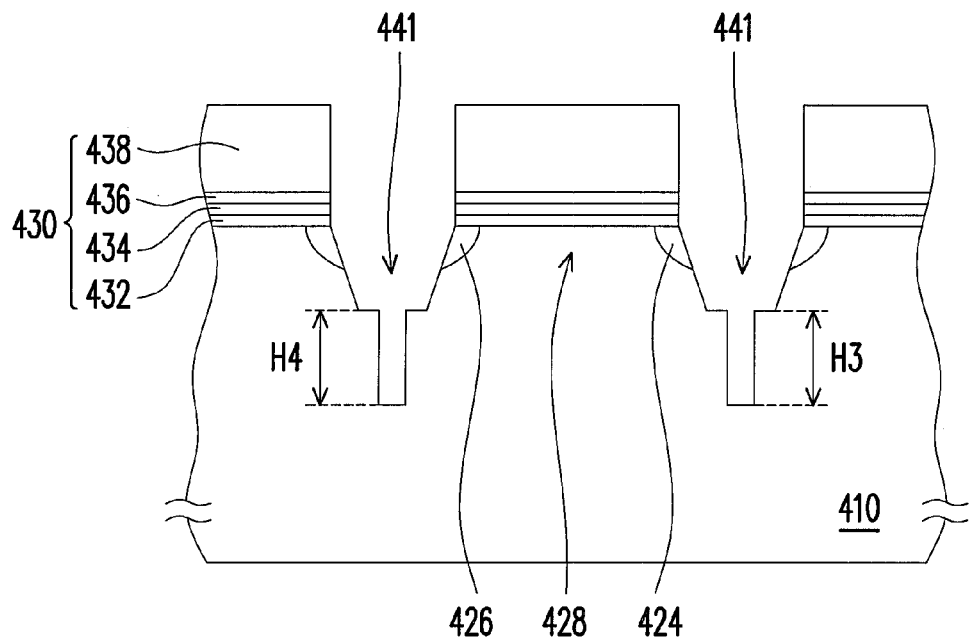

Then, referring to FIG. 4D, the spacers 442 and 443 are removed, and a method for removing the spacers 442 and 443 is, for example, wet etching.

Figure 4E:
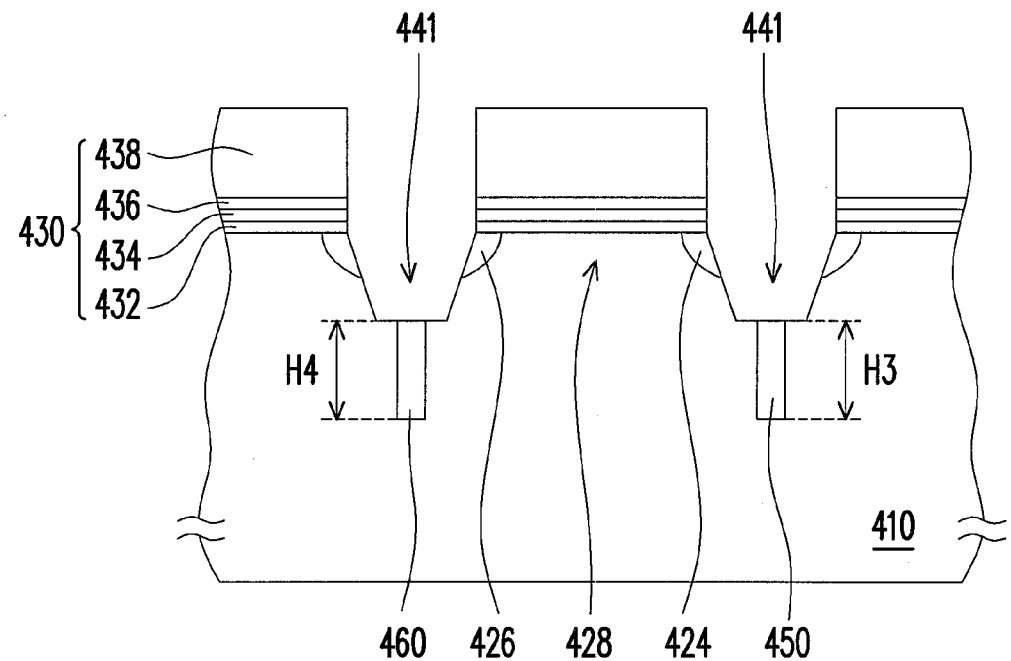

Then, referring to FIG. 4E, isolation structures 450 and 460 are respectively formed in the trenches 441 within the predetermined lengths H3 and H4. The isolation structures 450 and 460 are respectively connected to the doped regions 424 and 426 and extend downwards (i.e. a direction of the substrate 410) from the doped regions 424 and 426 for the predetermined lengths H3 and H4. The bottoms of the isolation structures 450 and 460 are respectively lower than that of the doped regions 424 and 426. Dielectric constants of the isolation structures 450 and 460 are, for example, greater than a dielectric constant of the substrate 410. The dielectric constants of the isolation structures 450 and 460 are, for example, between 1 and 12. Materials of the isolation structures 450 and 460 can be the same, which is, for example, a high dielectric material such as $SiO_2$, $SiN_x$ or gas (which represents that the isolation structures 450 and 460 are respectively a hollow structure). Moreover, shapes of the isolation structures 450 and 460 are not limited, though widths thereof are respectively less than widths of the doped regions 424 and 426. Although the isolation structures 450 and 460 are formed according to the above method, it is not used to limit the invention.

Figure 4F:
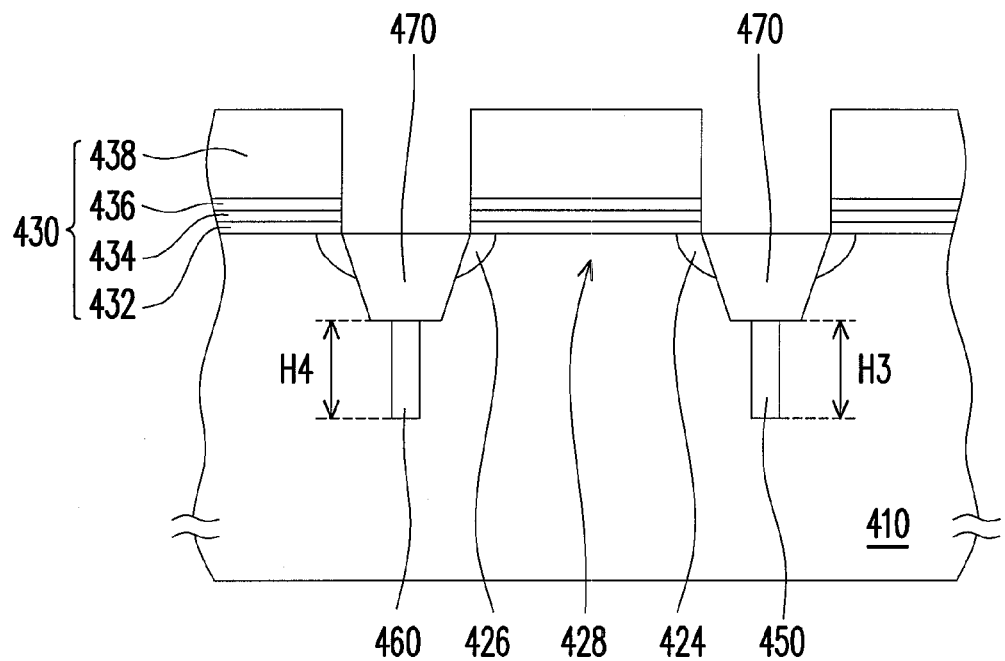

Then, referring to FIG. 4F, semiconductor layers 470 are formed to fill the trenches 441 outside the predetermined lengths H3 and H4. A method of forming the semiconductor layers 470 is, for example, a selective epitaxy growth (SEG) method.

Figure 4G:
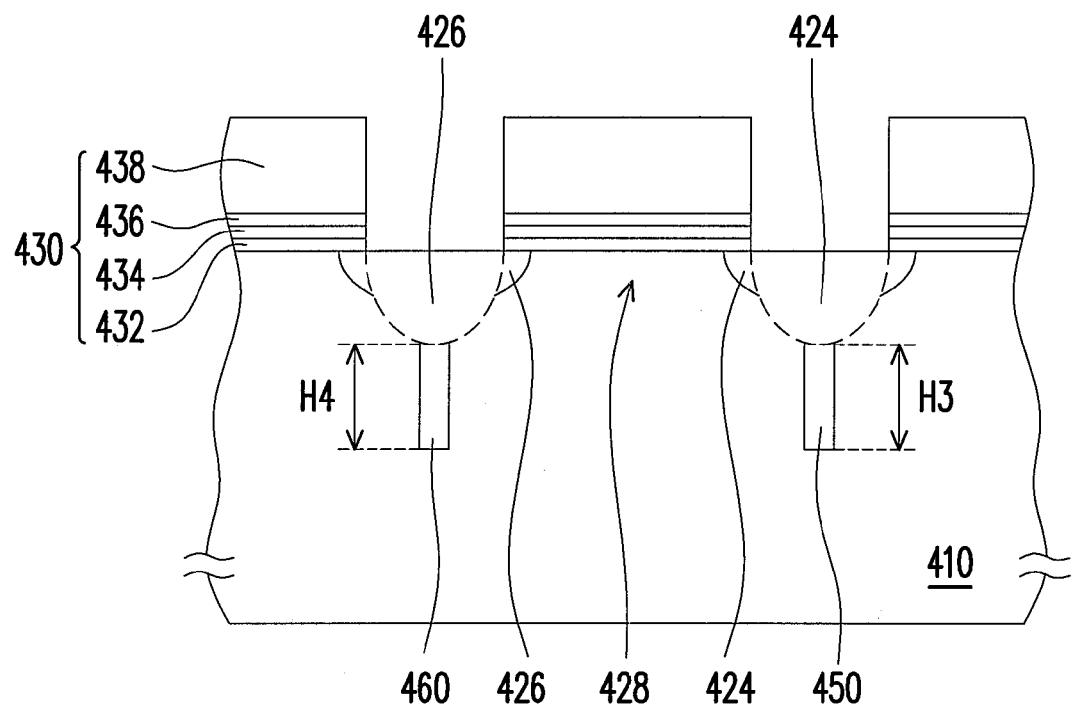

The, referring to FIG. 4G, the doped regions 424 and 426 are reformed in the semiconductor layers 470. A method of forming the doped regions 424 and 426 is, for example, ion implantation.

According to the above manufacturing processes, the isolation structures 450 and 460 can be formed beneath the doped regions 424 and 426, and original doped concentrations of the doped regions 424 and 426 can be recovered.

It should be noticed that although the manufacturing processes of simultaneously forming the isolation structures 450 and 460 beneath the doped regions 424 and 426 are described as an example, it is not used to limit the invention, and in other embodiments, only one of the isolation structures 450 and 460 can be formed, which may also achieve an effect of preventing the program disturbance.

Moreover, the manufacturing processes of forming the isolation structures 450 and 460 beneath the doped regions 424 and 426 are mainly described in the present embodiment, and methods of forming the doped regions 424 and 426, the channel region 428 and the stacked gate structure 430 are not limited by the present embodiment, so that a process sequence of forming the doped regions 424 and 426, the channel region 428 and the stacked gate structure 430 can be adjusted according to an actual manufacturing requirement. According to the above disclosure of the embodiment, those skilled in the art can easily deduce implementations thereof, so that detailed description thereof is not repeated.

In summary, in the embodiments of the present invention, the isolation structures are disposed beneath the source/drain doped regions of the memory cell, so as to prevent ionized electrons generated due to the program operation from moving to an adjacent memory cell to cause the program disturbance.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory cell, comprising:
  a substrate, having a first doped region, a second doped region and a channel region located between the first doped region and the second doped region;
  a stacked gate structure, disposed on the channel region, and at least comprising a charge trapping layer and a gate from bottom to top; and
  a first isolation structure, disposed in the substrate, connected to the first doped region and extending downwards from the first doped region for a predetermined length, wherein a bottom of the first isolation structure is lower than a bottom of the first doped region, and a width of the first isolation structure is smaller than a width of a space between the stacked gate structure and an adjacent gate structure.

2. The memory cell as claimed in claim 1, further comprising:
  a second isolation structure, disposed in the substrate, wherein the second isolation structure is connected to the second doped region and extends downwards from the second doped region for the predetermined length, and a bottom of the second isolation structure is lower than a bottom of the second doped region.

3. The memory cell as claimed in claim 2, wherein materials of the second isolation structure and the first isolation structure are the same.

4. The memory cell as claimed in claim 1, wherein a dielectric constant of the first isolation structure is higher than a dielectric constant of the substrate.

5. The memory cell as claimed in claim 1, wherein a material of the first isolation structure comprises $SiO_2$, $SiN_x$ or gas.

6. The memory cell as claimed in claim 1, wherein a width of the first isolation structure is less than a width of the first doped region.

7. The memory cell as claimed in claim 1, wherein the predetermined length is between 300 Å and 1500 Å.

8. A memory device, comprising:
  a driving circuit; and
  a memory cell array, coupled to the driving circuit, wherein the memory cell array has a plurality of memory cells connected with each other, and each of the memory cells comprises:
  a substrate, having a first doped region, a second doped region and a channel region located between the first doped region and the second doped region;
  a stacked gate structure, disposed on the channel region, and at least comprising a charge trapping layer and a gate from bottom to top; and
  a first isolation structure, disposed in the substrate, connected to the first doped region and extending downwards from the first doped region for a predetermined length, wherein a bottom of the first isolation structure is lower than a bottom of the first doped region, and a width of the first isolation structure is smaller than a width of a space between the stacked gate structure and an adjacent gate structure.

9. The memory device as claimed in claim 8, further comprising:
  a second isolation structure, disposed in the substrate, wherein the second isolation structure is connected to the second doped region and extends downwards from the second doped region for the predetermined length, and a bottom of the second isolation structure is lower than a bottom of the second doped region.

10. The memory device as claimed in claim 9, wherein materials of the second isolation structure and the first isolation structure are the same.

11. The memory device as claimed in claim 8, wherein a dielectric constant of the first isolation structure is higher than a dielectric constant of the substrate.

12. The memory device as claimed in claim 8, wherein a material of the first isolation structure comprises $SiO_2$, $SiN_x$ or gas.

13. The memory device as claimed in claim 8, wherein a width of the first isolation structure is less than a width of the first doped region.

14. The memory device as claimed in claim 8, wherein the predetermined length is between 300 Å and 1500 Å.

* * * * *